(12) United States Patent
Wang et al.

(10) Patent No.: US 11,605,352 B2
(45) Date of Patent: *Mar. 14, 2023

(54) DISPLAY PANEL AND PIXEL CIRCUIT

(71) Applicant: WUHAN TIANMA MICROELECTRONICS CO., LTD., Wuhan (CN)

(72) Inventors: Baonan Wang, Wuhan (CN); Xin Li, Wuhan (CN); Dongliang Dun, Wuhan (CN); Zhiqiang Xia, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/860,407

(22) Filed: Jul. 8, 2022

(65) Prior Publication Data

US 2022/0351686 A1 Nov. 3, 2022

Related U.S. Application Data

(63) Continuation of application No. 16/893,587, filed on Jun. 5, 2020, now Pat. No. 11,430,388.

(30) Foreign Application Priority Data

Mar. 24, 2020 (CN) .......................... 202010214590.3

(51) Int. Cl.
   *G09G 3/00* (2006.01)
   *G09G 3/3266* (2016.01)
   (Continued)

(52) U.S. Cl.
   CPC ......... *G09G 3/3266* (2013.01); *G09G 3/3241* (2013.01); *G09G 3/3275* (2013.01);
   (Continued)

(58) Field of Classification Search
   None
   See application file for complete search history.

(56) References Cited

U.S. PATENT DOCUMENTS

| 2010/0091000 A1* | 4/2010 | Lee ...................... G09G 3/3696 345/87 |
| 2018/0166025 A1* | 6/2018 | Zhou .................... G09G 3/3208 |
| 2018/0349662 A1* | 12/2018 | Lin ...................... A61B 5/7225 |

FOREIGN PATENT DOCUMENTS

| CN | 102654984 A | 9/2012 |
| CN | 108630146 A | 10/2018 |

(Continued)

OTHER PUBLICATIONS

State Intellectual Property Office of the People's Republic of China, Text of First Office Action dated Nov. 24, 2020, issued in Chinese Application No. 202010214590.3, filed Mar. 24, 2020, 23 pages.

*Primary Examiner* — Michael A Faragalla
(74) *Attorney, Agent, or Firm* — Christensen O'Connor Johnson Kindness PLLC

(57) ABSTRACT

Provided is a display panel including n pixel sets. Each pixel set includes 2m pixel rows arranged along a first direction. n and m are positive integers. Each pixel row includes pixel circuits arranged along a second direction intersecting with the first direction. Each pixel circuit includes a driving transistor, a first reset module configured to transmit, in response to a first scan signal provided by a first scan signal line, a first reset signal provided by a first reset signal line to a gate electrode of the driving transistor, and a second reset module configured to transmit, in response to a second scan signal provided by a second scan signal line, a second reset signal provided by a second reset signal line to an anode of an organic light-emitting element. The gate electrode receives high and low levels that are configured to reset the gate electrode.

13 Claims, 10 Drawing Sheets

(51) Int. Cl.
  *G09G 3/3241* (2016.01)
  *G09G 3/3275* (2016.01)
  *H01L 27/32* (2006.01)

(52) U.S. Cl.
  CPC . *H01L 27/3276* (2013.01); *G09G 2300/0842* (2013.01); *G09G 2310/0278* (2013.01); *G09G 2310/0286* (2013.01)

(56) References Cited

FOREIGN PATENT DOCUMENTS

| | | |
|---|---|---|
| CN | 108986742 A | 12/2018 |
| CN | 109285500 A | 1/2019 |
| CN | 110047432 A | 7/2019 |

* cited by examiner

DISPLAY PANEL AND PIXEL CIRCUIT

CROSS-REFERENCE TO RELATED APPLICATIONS

This application is a continuation of U.S. patent application Ser. No. 16/893,587, filed on Jun. 5, 2020, which claims priority to Chinese Patent Application No. 202010214590.3, filed on Mar. 24, 2020. All of the afore-mentioned patent applications are hereby incorporated by reference in their entireties.

TECHNICAL FIELD

The present disclosure relates to the field of display technologies, and in particular, to a display panel and a pixel circuit.

BACKGROUND

With the development of the display technology, an organic light-emitting diode (OLED) display panel, as a self-luminous device, not only requires for backlight, but also has excellent performances such as light weight, good shock resistance, fast response, wide visual angle, low energy consumption and good low-temperature characteristics, as compared with a traditional thin film transistor liquid crystal display (TFT-LCD).

An OLED device generally includes a number of pixels. Each pixel comprises a pixel circuit and an organic light-emitting structure. The pixel circuit provides a driving current to the organic light emitting structure, and the organic light emitting structure emits light in response to the driving current provided by the pixel circuit, thereby achieving display.

SUMMARY

In view of this, the present disclosure provides a display panel and a pixel circuit, aiming to achieve the more sufficient charging, reduce a difference between a brightness of a first frame and a brightness of another frame, and effectively alleviate a residual shadow phenomenon, thereby optimizing a display performance of the display device.

In an aspect, an embodiment of the present disclosure provides a display panel including n pixel sets. Each of the n pixel sets includes 2m pixel rows arranged along a first direction, where n and m are positive integers. Each of the 2m pixel rows includes a plurality of pixel circuits arranged along a second direction, and the second direction intersects with the first direction. Each of the plurality of pixel circuits includes: a driving transistor; a first reset module configured to transmit, in response to a first scan signal provided by a first scan signal line, a first reset signal provided by a first reset signal line to a gate electrode of the driving transistor, the gate electrode of the driving transistor being configured to receive a high level and a low level that are configured to reset the gate electrode of the driving transistor; and a second reset module configured to transmit, in response to a second scan signal provided by a second scan signal line, a second reset signal provided by a second reset signal line to an anode of an organic light-emitting element.

In another aspect, an embodiment of the present disclosure provides a pixel circuit. The pixel circuit includes a driving transistor electrically connected between a power signal line and an organic light-emitting element, a first reset module configured to reset a gate electrode of the driving transistor with a high level and a low level, and a second reset module configured to reset an anode of the organic light-emitting element. A driving period of the pixel circuit includes a plurality of sub-periods. In a first sub-period of the plurality of sub-periods, the first reset module is configured to reset the gate electrode of the driving transistor by the high level. In a second sub-period of the plurality of sub-periods, the first reset module is configured to reset the gate electrode of the driving transistor by the low level. The plurality of sub-periods is arranged sequentially in a timing sequence, the first sub-period is a first one of the plurality of sub-periods in the timing sequence, and the second sub-period is a second one of the plurality of sub-periods in the timing sequence.

In still another aspect, an embodiment of the present disclosure provides a display panel including a pixel circuit. The pixel circuit includes a driving transistor electrically connected between a power signal line and an organic light-emitting element, a first reset module configured to reset a gate electrode of the driving transistor with a high level and a low level, and a second reset module configured to reset an anode of the organic light-emitting element. A driving period of the pixel circuit includes a plurality of sub-periods. In a first sub-period of the plurality of sub-periods, the first reset module is configured to reset the gate electrode of the driving transistor by the high level. In a second sub-period of the plurality of sub-periods, the first reset module is configured to reset the gate electrode of the driving transistor by the low level. The plurality of sub-periods is arranged sequentially in a timing sequence, the first sub-period is a first one of the plurality of sub-periods in the timing sequence, and the second sub-period is a second one of the plurality of sub-periods in the timing sequence.

BRIEF DESCRIPTION OF DRAWINGS

The technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. Those skilled in the art may obtain other embodiments without creative efforts according to the accompanying drawings of the present disclosure.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although a transistor may be described using the terms of "first", "second", "third", etc., in the embodiments of the present disclosure, the transistor will not be limited to these terms. These terms are merely used to distinguish transistors from one another. For example, without departing from the scope of the embodiments of the present disclosure, a first transistor may also be referred to as a second transistor, and similarly, a second transistor may also be referred to as a first transistor.

Figure 1:
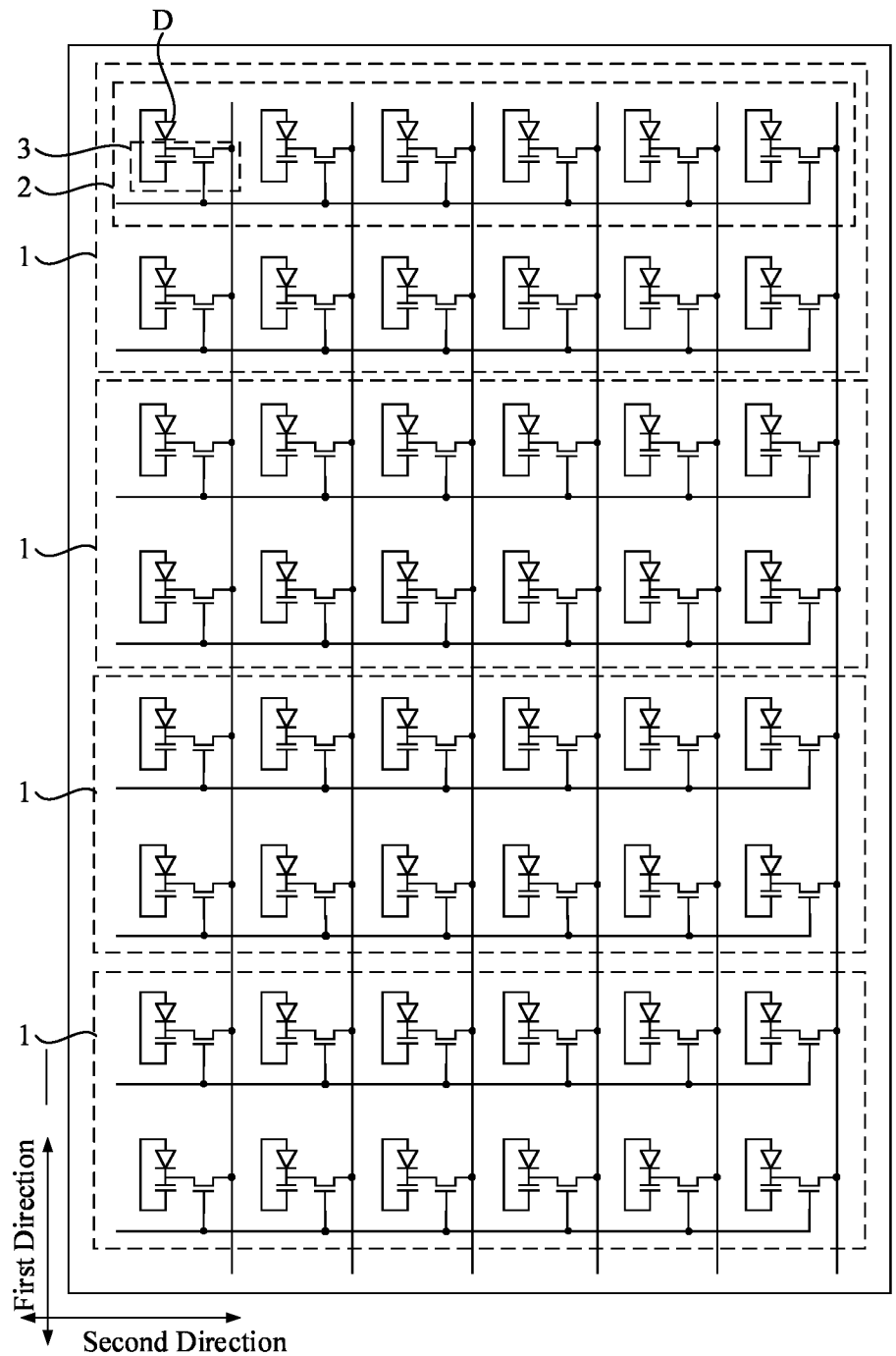
FIG. 1 is a schematic diagram of a structure of a display panel according to an embodiment of the present disclosure.

Embodiments of the present disclosure provide a display panel. FIG. 1 is a schematic diagram of a structure of a display panel according to an embodiment of the present disclosure. As shown in FIG. 1, the display panel includes n pixel sets 1, and each pixel set 1 includes 2m pixel rows 2 arranged along a first direction, where n and m are positive integers greater than or equal to 1. Each pixel row 2 includes a plurality of pixel circuits 3 arranged along a second direction. The second direction intersects with the first direction.

Figure 2:
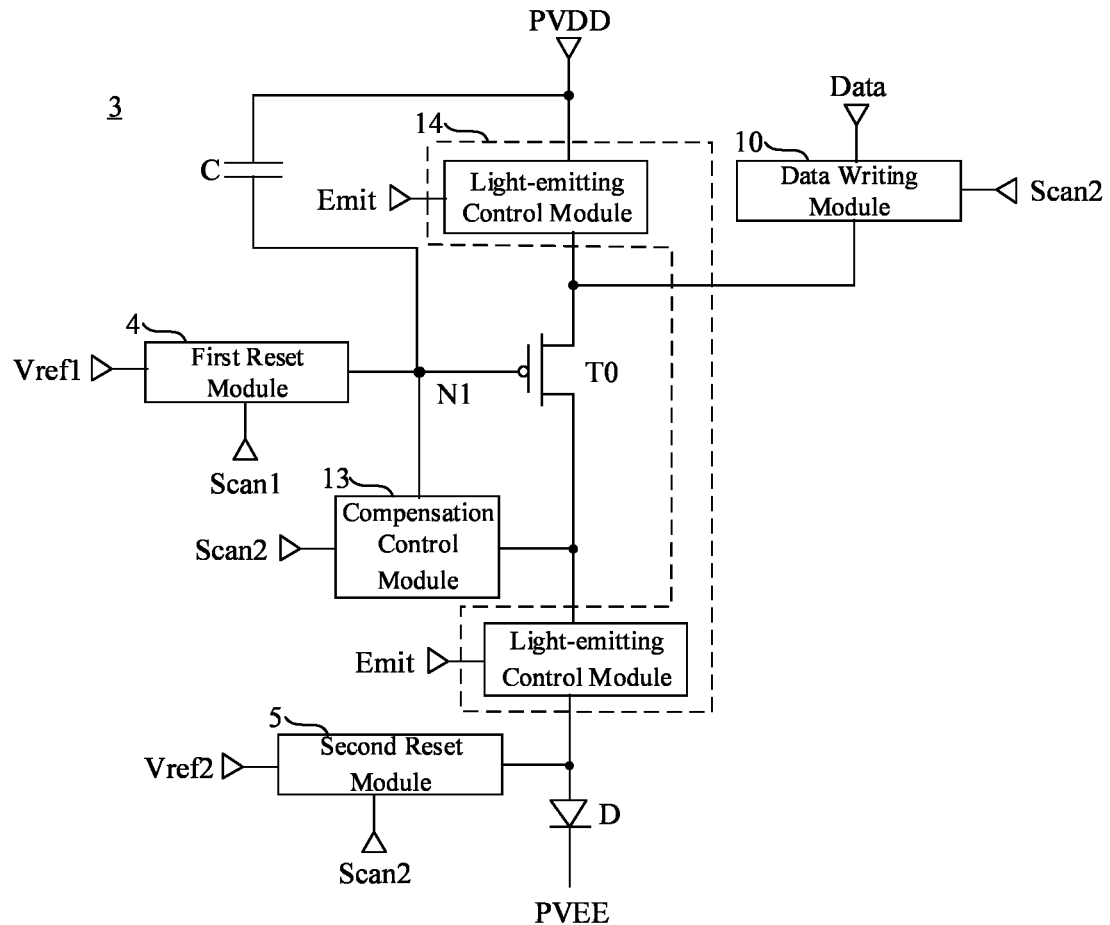
FIG. 2 is a schematic diagram of a structure of a pixel circuit according to an embodiment of the present disclosure.
Figure 3:
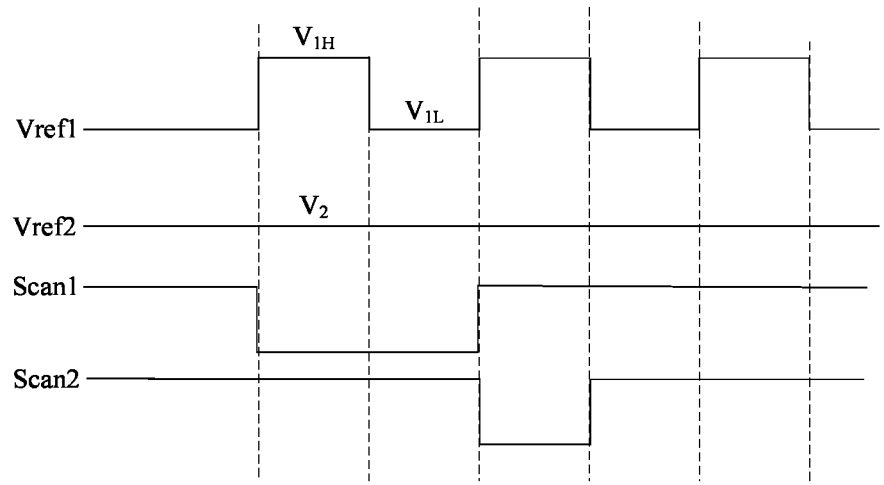
FIG. 3 is a time sequence diagram of a first reference signal and a second reference signal according to an embodiment of the present disclosure.

FIG. 2 is a schematic diagram of a structure of a pixel circuit according to an embodiment of the present disclosure, and FIG. 3 is a time sequence diagram of a first reference signal and a second reference signal according to an embodiment of the present disclosure. As shown in FIG. 2 and FIG. 3, the pixel circuit 3 includes a driving transistor T0, a first reset module 4, and a second reset module 5. The first reset module 4 is configured to transmit, in response to a first scan signal provided by a first scan signal Scan1, a first reset signal provided by a first reset signal line Vref1 to a gate electrode of the driving transistor T0. The first reset signal includes alternating high and low levels. The first reset signal resets the gate electrode of driving transistor T0 by using its low level. For example, the first reset signal may be a square signal. The second reset module 5 is configured to transmit, in response to a second scan signal provided by a second scan signal line, a second reset signal provided by a second reset signal line Vref2 to an anode of an organic light-emitting element D.

For the display panel provided by this embodiment of the present disclosure, the first reset module 4 and the second reset module 5 are electrically connected to different reset signal lines, so that the first reset module 4 and the second reset module 5 respectively reset the gate electrode of the driving transistor T0 and the anode of the organic light-emitting element D by using different reset signals. In this way, when it is needed to pull down the second reset signal in order to alleviate a sub-pixel light stealing phenomenon, a low-level potential of the first reset signal does not need to be pulled down as the second reset signal is pulled down, so that the low-level potential of the first reset signal can be higher than a potential of the pulled-down second reset signal. In this way, after the gate electrode of the driving transistor T0 has been reset, a data signal can be written to the gate electrode of the driving transistor T0 on basis of a slightly higher low-level potential. Therefore, a voltage difference between an initial potential of the gate electrode of the driving transistor T0 and the data signal to be written can be reduced, so that the data signal can be more sufficiently written during a charging period.

Figure 4:
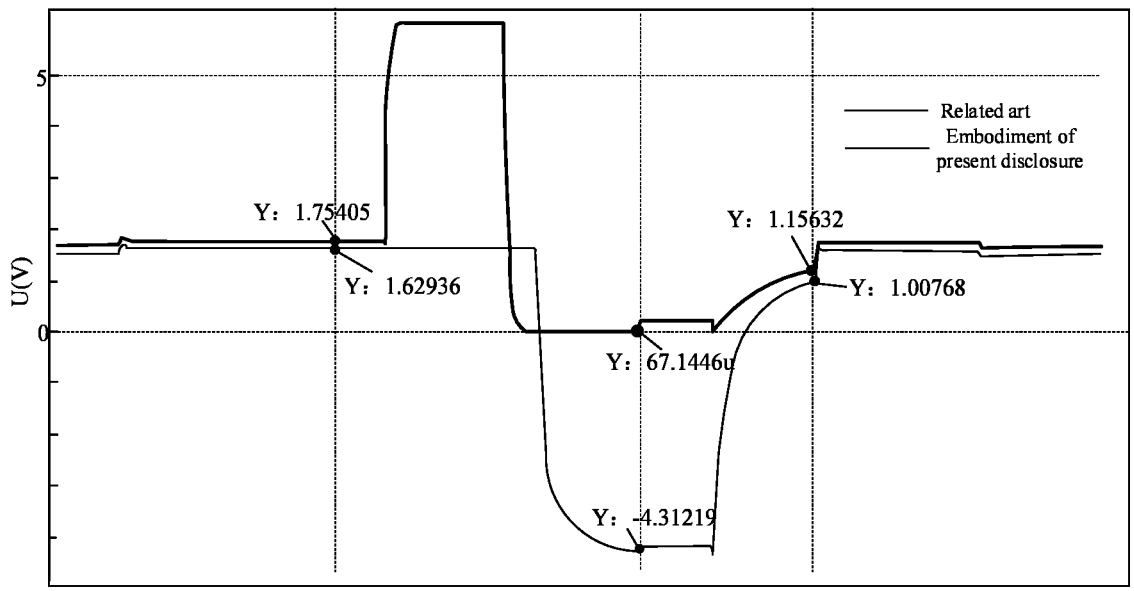
FIG. 4 is a simulation diagram corresponding to Table 1 according to an embodiment of the present disclosure.

FIG. 4 is a simulation diagram corresponding to Table 1 according to an embodiment of the present disclosure. With reference to Table 1 and FIG. 4, in an example, a voltage of the gate electrode of the driving transistor T0 (first node N1) is 1.981V after being charged in an ideal state. In this case, with the technical solution in the related art, it is assumed that the first reset signal is pulled down to −4.5V with the second reset signal. It was found through test that after resetting the first node N1 by using the voltage of −4.5V and charging the first node N1, the potential of the first node N1 after being charged might be up to 1.00768V, which is greatly different from an ideal voltage value. However, with the technical solution in this embodiment of the present disclosure, since the first reset signal is independently set, a slightly higher voltage value can be set for the low-level potential of the first reset signal. Taking 0V as an example, it was found through test that after resetting the first node N1 by using a voltage of 0V and charging the first node N1, the potential of the first node N1 after being charged in this embodiment of the present disclosure might be pulled up to 1.15632V. Therefore, the technical solution provided by this embodiment of the present disclosure enables the data signal to be more completely written at the first node N1, thereby making it closer to the ideal value. Thus, a light-emitting brightness of the organic light-emitting element D approaches a standard brightness.

In addition, it should be noted that with further reference to Table 1 and FIG. 4, when a reset time is a constant, since the potential of the first reset signal in the related art is pulled down to be lower, when performing reset on basis of the potential of the first node N1 before the reset, a voltage difference between the two is relatively large. In this case, an actual potential of the first node N1 after the reset is −4.3122V, which deviates from −4.5V, making the reset inaccurate. However, in this embodiment of the present disclosure, since the low-level potential of the first reset signal can be set to a lightly higher value, a voltage difference between the low-level potential and the potential of the first node N1 before reset is smaller. In this embodiment of the present disclosure, the voltage of the first node N1 after reset is 0.00006V, which approaches 0V, thereby increasing an accuracy of the reset and thus further increasing an accuracy of data signal writing.

TABLE 1

|  | Voltage of the first node N1 before reset (V) | Voltage of the first node N1 after reset (V) | Voltage of the first node N1 after being charged (V) |
|---|---|---|---|
| Related art | 1.62936 | −4.3122 | 1.00768 |
| Embodiment of the present disclosure | 1.75405 | 0.00006 | 1.15632 |

In addition, when the screen is being switched between high and low gray levels, multiple refreshes are required. In the related art, a brightness of refresh in a first frame is quite different from a brightness of refresh in other frames. However, according to the technical solution provided by this embodiment of the present disclosure, since the data signal is more sufficiently written during the charging period, the potential of the first node N1 after being charged can be higher. That is, a light-emitting brightness of the organic light-emitting element D becomes smaller, thereby reducing a difference between the brightness of refresh in the first frame and the brightness of refresh in the other frames.

Figure 5:
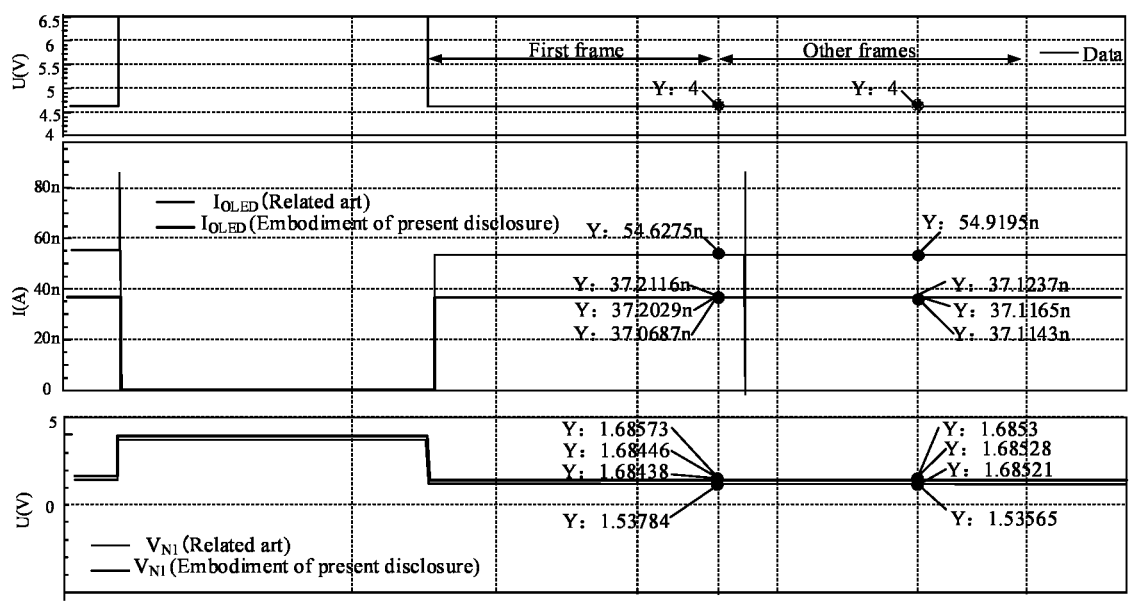
FIG. 5 is a simulation diagram corresponding to Table 2 according to an embodiment of the present disclosure.

FIG. 5 is a simulation diagram corresponding to Table 2 according to an embodiment of the present disclosure. With reference to FIG. 2 and FIG. 5, in an example, the first reset signal is pulled down to −4.5V with the second reset signal in the related art, and the low-level potential of the first reset signal in this embodiment of the present disclosure is 0V. In this case, it was found through test that, in the related art, a driving current in the first frame and a driving current in other frame are large, that is, a brightness in the first frame and a brightness in the other frames are large, and a difference between the brightness in the first frame and the brightness of the other frames is also large. However, when adopting the technical solution in this embodiment of the present disclosure, since the potential of the first node N1 after being charged is higher than that in the related art, the brightness in the first frame and the brightness in the other frames can be smaller. In this case, a difference between the driving current in the first frame and the driving current in the other frames can be reduced from 0.52% in the related art to −0.24% or 0.13%, which is equivalent to reducing the difference between the brightness in the first frame and the brightness in the other frames to −0.24% or 0.13%. Thus, a difference between the brightness in the first frame and the brightness in the other frames can be reduced.

TABLE 2

|  | Vref1 high-level potential (V) | Vref1 low-level potential (V) | Driving current in first frame (nA) | Driving current in other frames (nA) | Difference by proportion (%) | Potential of first node N1 in first frame (V) | Potential of first node N1 in other frames (V) | Difference by proportion (%) |
|---|---|---|---|---|---|---|---|---|
| The related art |  | −4.5 | 54.6288 | 54.9168 | 0.52 | 1.53783 | 1.53564 | −0.14 |
| The embodiment of the present disclosure | 6 | 0 | 37.2127 | 37.1244 | −0.24 | 1.68437 | 1.6852 | 0.05 |
|  | 5 | 0 | 37.204 | 37.115 | −0.24 | 1.68445 | 1.68529 | 0.05 |
|  | 4 | 0 | 27.0698 | 37.1172 | 0.13 | 1.68572 | 1.6853 | −0.02 |

Further, it has been found that when the low-level potential of the first reset signal is constant and the high-level potential of the first reset signal is decreased, that is, a potential difference between the high-level potential and the low-level potential is decreased, when the first reset signal is switched from the high level to the low level, the signal can be switched more sufficiently. In this way, the potential received by the gate electrode of the driving transistor T0 more approaches a standard low-level potential of the first reset signal, thereby further adjusting the brightness in the first frame. For example, with reference to Table 2, the brightness in the first frame is adjusted from a large brightness to a small brightness, thereby further reducing the difference between the brightness in the first frame and the brightness in other frames.

In addition, compared to a case in the related art in which the first reset signal is directly set to a DC signal having a constant voltage, in this embodiment of the present disclosure, the first reset signal is set to an AC signal having alternating high and low levels. In this case, when resetting the gate electrode of the driving transistor T0, the driving transistor T0 is first turned off under an action of a high level, and then turned on under an action of a low level. This can avoid the threshold voltage deviation due to a long-term bias of the driving transistor T0, thereby effectively alleviating a residual shadow phenomenon.

In addition, it should be noted that in order to verify that the first reset signal being set to an AC signal does not affect the light-emitting brightness of the organic light-emitting element, the inventors also conducted a following research. In a same pixel circuit structure, the first reset module is provided with a DC first reset signal and an AC first reset signal having a same low potential, for example, the low level-potential is −4.5V. With reference to Table 3, it was found through test that after the first reset signal was set to an AC signal in this embodiment of the present disclosure, the driving current flowing through the organic light-emitting element D did not fluctuate significantly. Compared to the related art, a difference is approximately 0.05 nA, which is negligible. Therefore, setting the first reset signal to an AC signal having alternating high and low levels does not affect the driving current, and thus does not affect normal light emission of the organic light-emitting element D.

TABLE 3

| Related art | | Embodiment of the present disclosure | |
|---|---|---|---|
| $I_{OLED}$_max (nA) | $I_{OLED}$_min (nA) | $I_{OLED}$_max (nA) | $I_{OLED}$_min (nA) |
| 82.44476 | 75.76845 | 82.51419 | 75.82861 |
| 82.42238 | 75.74728 | 82.48011 | 75.79681 |
| 82.36274 | 75.69216 | 82.41031 | 75.73148 |
| 82.34194 | 75.67425 | 82.39816 | 75.72190 |
| 82.34966 | 75.68424 | 82.42445 | 75.74972 |

Figure 6:
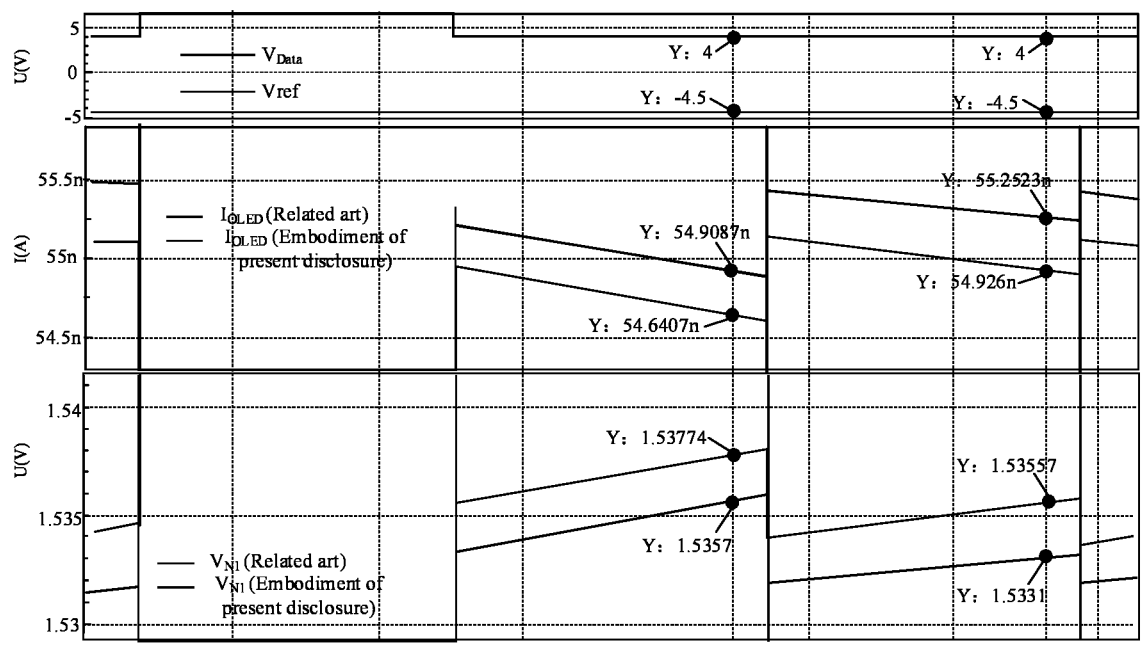
FIG. 6 is a simulation diagram corresponding to Table 4 according to an embodiment of the present disclosure.

Further, fluctuations of the driving current were also tested in the first frame and in other frames. In a same pixel circuit structure, the first reset module is provided with a DC first reset signal and an AC first reset signal having a same low potential, for example, the low-level potential is −4.5V. FIG. 6 is a simulation diagram corresponding to Table 4 according to an embodiment of the present disclosure. With reference to Table 4 and FIG. 6, it was found through test that after the first reset signal was set to an AC signal in this embodiment of the present disclosure, the driving current flowing through the organic light-emitting element D did not fluctuate significantly. Compared to the related art, a difference is very small. Therefore, setting the first reset signal to an AC signal having alternating high and low levels does not affect the driving current in the first frame and in other frames when the screen is being switched between high and low gray levels, and thus does not affect normal display in the first frame and in other frames.

TABLE 4

| | Potential of first node N1 (V) | | Driving current (nA) | |
|---|---|---|---|---|
| | First frame | Other frames | First frame | Other frames |
| Related art | 1.5378 | 1.5356 | 54.64 | 54.93 |
| Embodiment of the present disclosure | 1.5357 | 1.5331 | 54.91 | 55.25 |

In an example, with reference to FIG. 3, the second reset signal is a DC signal. In this case, the second reset signal has a stable low potential, thereby increasing reliability of resetting the anode of the organic light-emitting element D.

In an example, with reference to FIG. 3, the voltage of the second reset signal is $V_2$, where $-5V \leq V_2 \leq -3V$. Setting $V_2$ to be within a range from −5V to −3V can provide a lower reset potential to the anode of the organic light-emitting element D, thereby avoiding a potential difference between the anode and cathode of the organic light-emitting element D during a non-light-emission period, which would otherwise drive the organic light-emitting element D to emit light. In this way, the organic light-emitting element D will not emit light during the non-light-emission period, thereby effectively alleviating a sub-pixel light stealing phenomenon.

In an example, with reference to FIG. 3, a high-level voltage of the first reset signal is $V_{1H}$, where $V_{1H} \leq 5V$, and a low-level voltage of the first reset signal is $V_{1L}$, where $V_{1L} \geq -4.5V$. $V_{1H}$ is set to be not higher than 5V, so that the high-level potential will not be extremely high, thereby avoiding an extremely large difference between the high level and the low level of the first reset signal. In this way, when the first reset signal is switched from the high level to the low level, the signal can be switched more sufficiently. Thus, the low-level potential received by the gate electrode of the driving transistor T0 more approaches the standard low-level potential, thereby increasing an accuracy of the signal. Moreover, with reference to FIG. 2, $V_{1H}$ is set to be not higher than 5V, so that a difference between the brightness in the first frame and the brightness in other frames can be further reduced, thereby further optimizing the display performance. $V_{1L}$ is set to be not lower than −4.5V, so that the low-level voltage of the first reset signal will not be extremely low, and thus the data signal can be more sufficiently written during the charging period.

In an example, the low-level voltage $V_{1L}$ of the first reset signal is higher than the voltage $V_2$ of the second reset signal. In this case, when the anode of the organic light-emitting element D is reset by using the lower $V_2$ to alleviate the sub-pixel light stealing phenomenon, the display performance of the display panel can also be optimized by using the higher $V_{1L}$, such as making the charging more sufficient and reducing the difference between the brightness in the first frame and the brightness in other frames.

Figure 7:
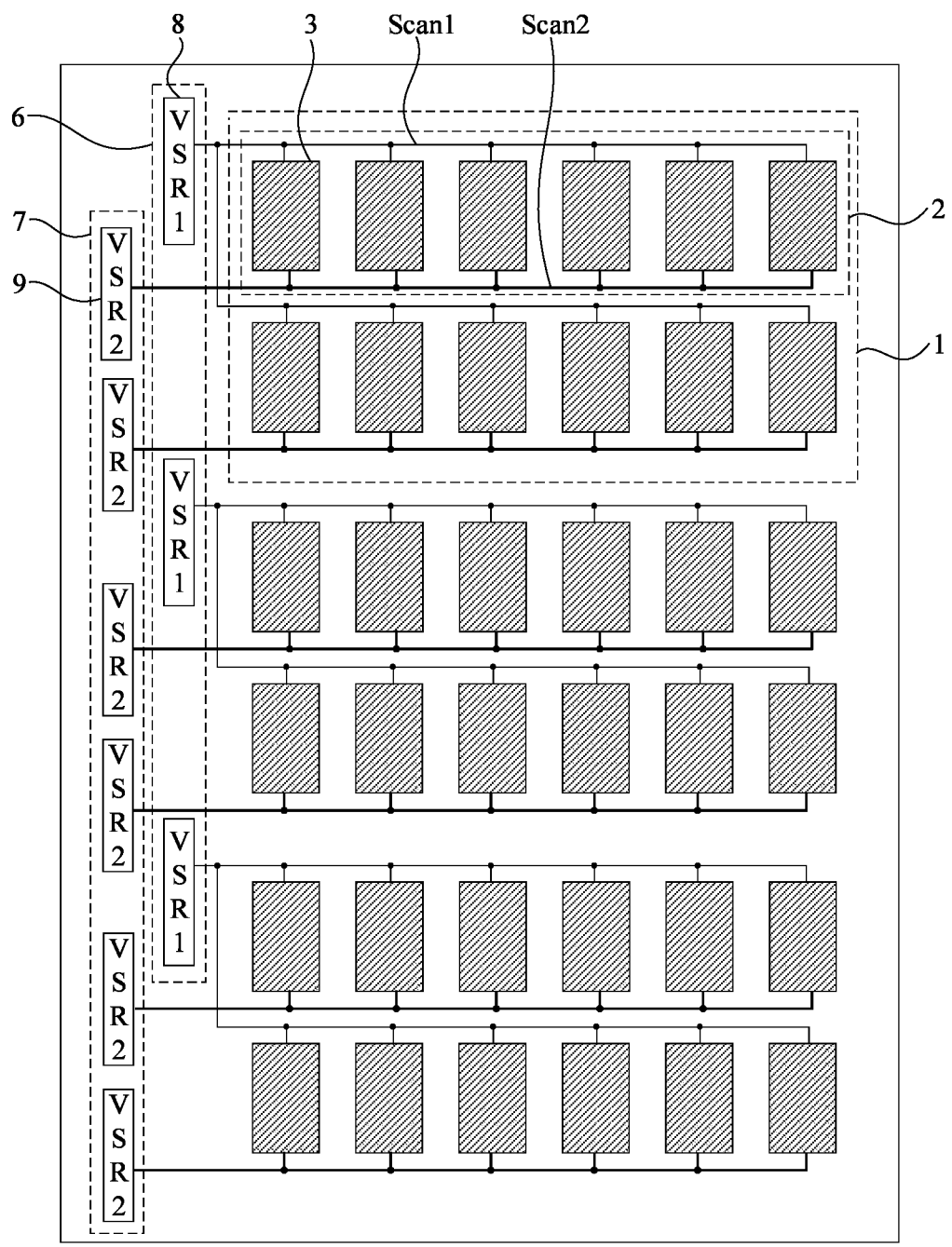
FIG. 7 is a schematic diagram of another structure of a display panel according to an embodiment of the present disclosure.

FIG. 7 is a schematic diagram of a structure of another display panel according to an embodiment of the present disclosure. In an example, as shown in FIG. 7, the display panel further includes a first shift register 6 and a second shift register 7. The first shift register 6 includes n first shift register units 8 that are cascaded, and the n first shift register units 8 one-to-one correspond to n pixel sets 1. Each first shift register unit 8 is electrically connected to 2m first scan signal lines Scan1 of the corresponding 2m pixel rows 2. The second shift register 7 includes 2m*n second shift register units 9 that are cascaded, and the 2m*n second shift register units 9 one-to-one correspond to 2m*n pixel rows 2. Each second shift register unit 9 is electrically connected to the second scan signal line Scan2 of the corresponding pixel row 2.

Figure 8:
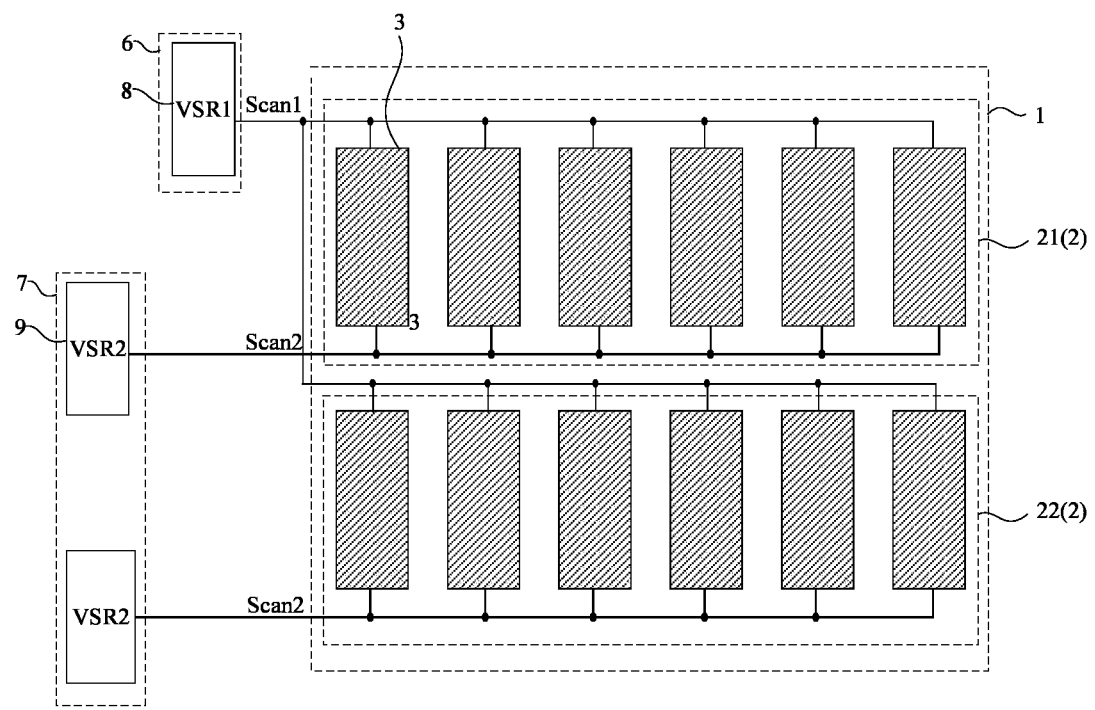
FIG. 8 is a schematic diagram of a part of a display panel according to an embodiment of the present disclosure.
Figure 9:
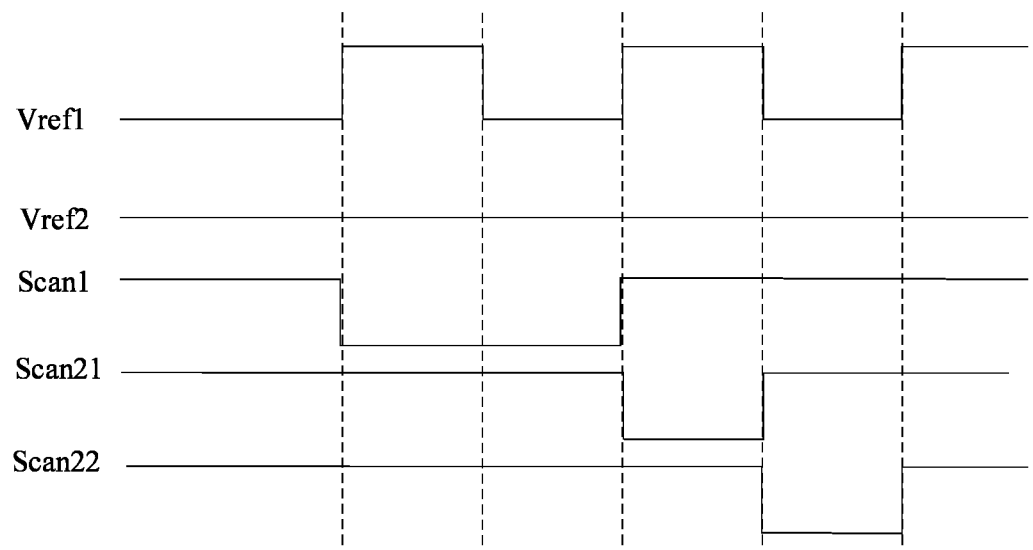
FIG. 9 is a time sequence diagram corresponding to FIG. 8.

FIG. 8 is a schematic diagram of a part of a display panel according to an embodiment of the present disclosure, and FIG. 9 is a time sequence diagram corresponding to FIG. 8. With reference to FIG. 8 and FIG. 9, taking m=1 and the pixel set 1 including two pixel rows 2 (a first pixel row 21 and a second pixel row 22) as an example, operating principles of the first shift register 6 and the second shift register 7 will be described in details in the following.

When the first reset signal is switched from the low level to the high level, the first shift register unit 8 outputs a low level to the first scan signal line Scan1 electrically connected thereto. At this time, the first reset module 4 of the pixel circuit 3 in the first pixel row 21 and the second pixel row 22 transmits the first reset signal to the gate electrode of the driving transistor T0 in response to the first scan signal, and the gate electrode of the driving transistor T0 is reset by using the low level of the first reset signal. When the first scan signal outputted from the first shift register unit 8 is switched from the low level to the high level, the second shift register unit 9 corresponding to the first pixel row 21 outputs a low level to the second scan signal line Scan2 electrically connected thereto. At this time, the second reset module 5 of the pixel circuit 3 in the first pixel row 21 transmits the second reset signal to the anode of the organic light-emitting element D in response to the second scan signal, and the anode of the organic light-emitting element D is reset by using the second reset signal. When the signal outputted from the second shift register unit 9 corresponding to the first pixel row 21 is switched from the low level to the high level, the second shift register unit 9 corresponding to the second pixel row 22 outputs a low level to the second scan signal line Scan2 electrically connected thereto. At this time, the second reset module 5 of the pixel circuit 3 in the second pixel row 22 transmits the second reset signal to the anode of the organic light-emitting element D in response to the second scan signal, and the anode of the organic light-emitting element D is reset by using the second reset signal. At this time, both the first pixel row 21 and the second pixel row 22 complete reset of the gate electrode of the driving transistor T0 and the anode of the organic light-emitting element D, thereby achieving the reset function.

Based on connections among the shift register, the scan signal line and the pixel rows in the related art, for two adjacent pixel rows, the second scan signal outputted by the shift register to a previous pixel row is also the first scan signal of a next pixel row. That is, in the related art, one shift register needs to drive two pixel rows. According to the embodiments of the present disclosure, each second shift register unit 9 only needs to drive one pixel row 2, thereby reducing a delay of the second scan signal in a transmission process. Thus, each pixel row 2 can be driven more accurately by using the second scan signal.

In an example, further referring to FIG. 7 and FIG. 8, where m=1, each first scan signal line Scan1 is only electrically connected to two pixel rows 2. A number of pixel rows 2 that needs to be driven is small, thereby reducing a delay of the first scan signal in the transmission process. Thus, each pixel row 2 can be driven more accurately by using the first scan signal.

It should be noted that the first shift register 6 can adopt a bilateral driving manner or a unilateral driving manner. Similarly, the second shift register 7 can adopt a bilateral driving manner or a unilateral driving manner.

In addition, it should be noted that when the shift register adopts the setting manner and driving method described above, a structure of a driving chip can be adjusted accordingly, so that the driving chip can output a control signal that drives the first shift register 6 and the second shift register 7 to operate normally, such as a clock control signal, a frame start signal, etc.

Figure 10:
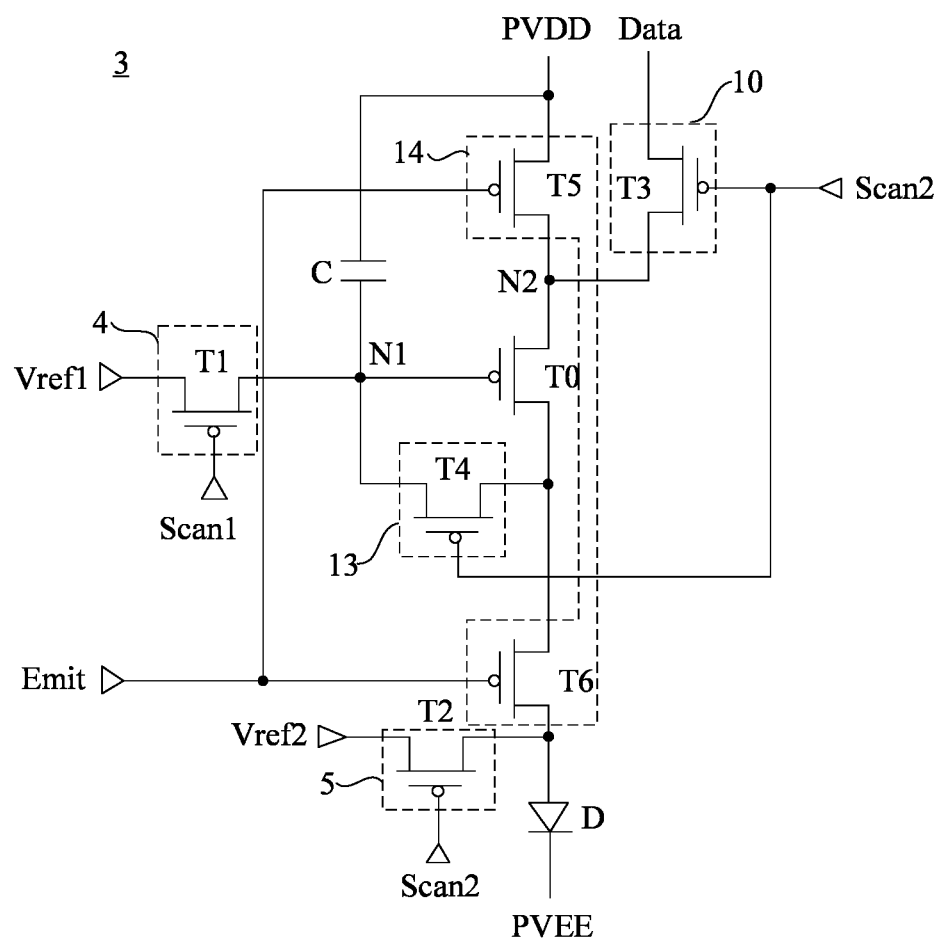
FIG. 10 is a schematic diagram of a structure of another pixel circuit according to an embodiment of the present disclosure.

FIG. 10 is a schematic diagram of another structure of a pixel circuit according to an embodiment of the present disclosure. Further, as shown in FIG. 10, the first reset module 4 includes a first transistor T1. The first transistor T1 includes a gate electrode electrically connected to the first scan signal line Scan1, a first electrode electrically connected to the first reset signal line Vref1, and a second electrode electrically connected to the gate electrode of the driving transistor T0. When the first scan signal line Scan1 provides a low level, the first transistor T1 is turned on under an action of the low level and transmits the first reset signal provided by the first reset signal line Vref1 to the gate electrode of the driving transistor T0. In this way, the gate electrode of the driving transistor T0 is reset by using the low level of the first reset signal. The second reset module 5 includes a second transistor T2. The second transistor T2 includes a gate electrode electrically connected to the second scan signal line Scan2, a first electrode electrically connected to the second reset signal line Vref2, and a second electrode electrically connected to the anode of the organic light-emitting element D. When the second scan signal line Scan2 provides a low level, the second transistor T2 is turned on under an action of the low level and transmits the second reset signal provided by the second reset signal line Vref2 to the anode of the organic light-emitting element D. In this way, the anode of the organic light-emitting element D is reset by using the second reset signal.

In an example, with further reference to FIG. 2, the pixel circuit 3 further includes a data signal writing module 10, a compensation control module 13, a light emission control module 14, and a storage capacitor C. The data signal writing module 10 is configured to transmit, in response to the second scan signal, the data signal provided by the data line Data to the first electrode of the driving transistor T0. The compensation control module 13 is configured to transmit the signal of the second electrode of the driving transistor T0 to the gate electrode of the driving transistor T0 in respond to the second scan signal. The light-emitting control module 14 is configured to transmit, in response to a light-emitting control signal provided by a light-emitting control signal line Emit, a driving current signal converted from the data signal and a power signal provided by a power signal line PVDD to the anode of the organic light-emitting element D. The storage capacitor C includes a first electrode plate electrically connected to the power signal line PVDD, and a second electrode plate electrically connected to the gate electrode of the driving transistor T0 for stabilizing a potential of the gate electrode of the driving transistor T0.

With cooperation of the driving transistor T0, the first reset module 4, the second reset module 5, the data signal writing module 10, the compensation control module 13 and the light-emitting control module 14, the organic light-emitting element D is driven to emit light normally, and an affection on the light-emitting brightness of the organic light-emitting element D caused by a threshold voltage of the driving transistor T0 can be eliminated. An operating principle of the pixel circuit 3 will be described in details in the following embodiments.

Further, with further reference to FIG. 10, the data signal writing module 10 includes a third transistor T3. The third transistor T3 includes a gate electrode electrically connected to the second scan signal line Scan2, a first electrode electrically connected to a data line Data, and a second electrode electrically connected to the first electrode of the driving transistor T0. The compensation control module 13 includes a fourth transistor T4. The fourth transistor T4 includes a gate electrode electrically connected to the second scan signal line Scan2, a first electrode electrically connected to the second electrode of the driving transistor T0, and a second electrode electrically connected to the gate electrode of the driving transistor T0. The light-emitting control module 14 includes a fifth transistor T5 and a sixth transistor T6. The fifth transistor T5 includes a gate electrode electrically connected to the light-emitting control signal line Emit, a first electrode electrically connected to the power signal line PVDD, and a second electrode electrically connected to the first electrode of the driving transistor T0. The sixth transistor T6 includes a gate electrode electrically connected to the light-emitting control signal line Emit, a first electrode electrically connected to the second electrode of the driving transistor T0, and a second electrode electrically connected to the anode of the organic light-emitting element D.

Figure 11:
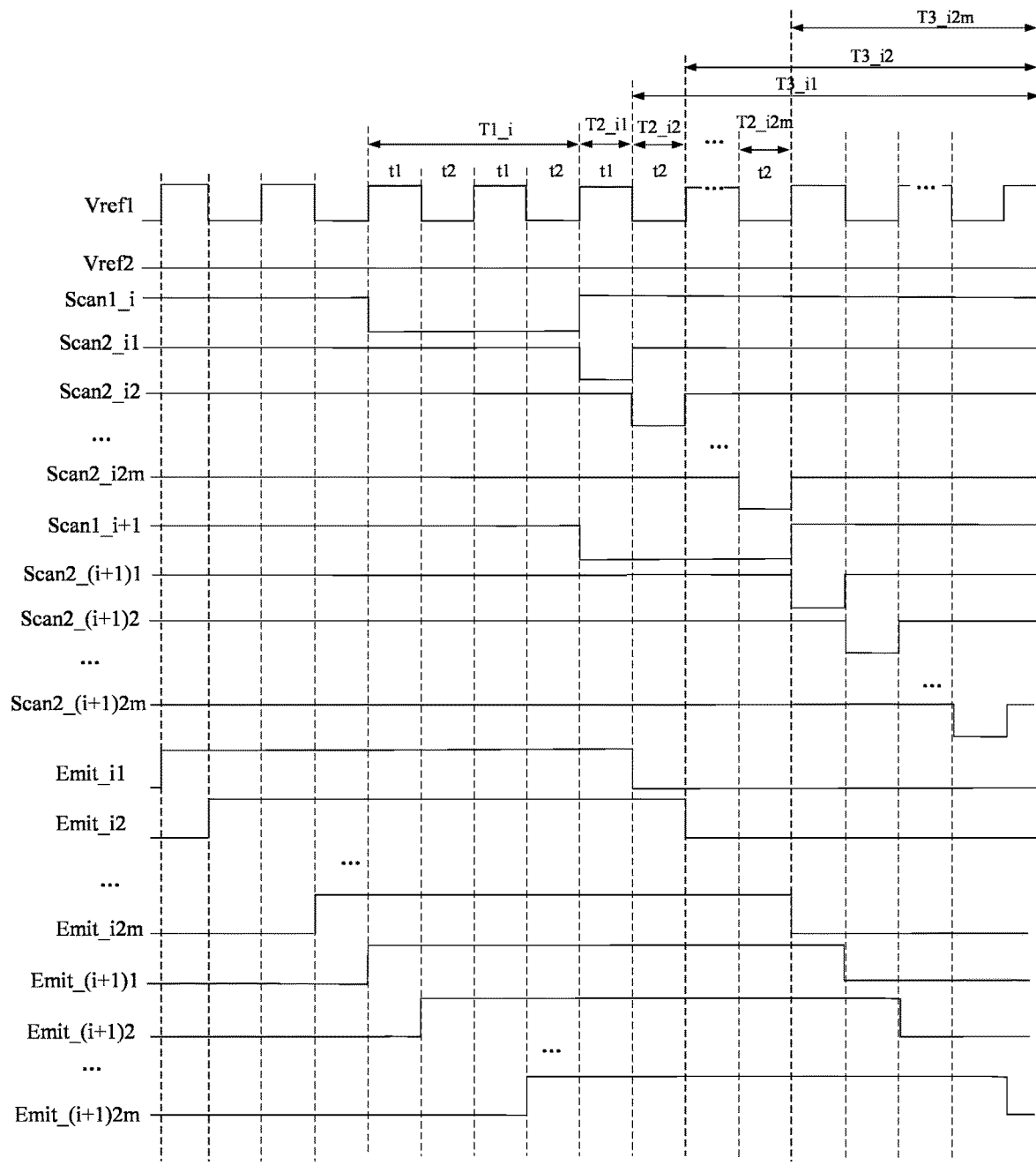
FIG. 11 is a time sequence diagram corresponding to a display panel according to an embodiment of the present disclosure.

FIG. 11 is a time sequence diagram corresponding to a display panel according to an embodiment of the present disclosure. With reference to FIG. 10 and FIG. 11, an operating principle of the pixel circuit 3 will be described in details. Scan1_$i$ shown in FIG. 11 represents a first scan signal provided by a first scan signal line Scan1 corresponding to an $i^{th}$ pixel set 1, Scan2_$ix$ represents a second scan signal provided by a second scan signal line Scan2 corresponding to an $x^{th}$ pixel row 2 in the $i^{th}$ pixel set 1, and Emit_ix represents a light-emitting control signal provided by a light-emitting control signal line Emit corresponding to the $x^{th}$ pixel row 2 in the $i^{th}$ pixel set 1. Here, x ranges from 1 to 2m.

One-frame driving period of the pixel circuit 3 includes multiple sub-periods. The multiple sub-periods include first sub-periods t1 and second sub-periods t2 that occur alternately. The first reset signal is at a high level in the first sub-period t1 and at a low level in the second sub-period t2. The one-frame driving period of the pixel circuit 3 includes a first period T1, a second period T2 and a third Period T3 (only the first period T1, the second period T2, and the third period T3 corresponding to the $i^{th}$ pixel set 1 are illustrated in FIG. 11, where T1_$i$ represents the first period corresponding to all pixel rows 2 in the $i^{th}$ pixel set 1, T2_$ix$ represents the second period corresponding to the $x^{th}$ pixel row 2 in the $i^{th}$ pixel set 1, and T3_$ix$ represents the third period corresponding to the $x^{th}$ pixel row 2 in the $i^{th}$ pixel set 1). The first period T1 includes m first sub-periods t1 and m second sub-periods t2, and a first sub-period of the first period T1 is the first sub-period t1. The second period T2 includes one first sub-period t1 or one second sub-period t2. When the pixel circuit 3 belongs to an $x^{th}$ pixel row 2 in the pixel set 1, there are (x−1) sub-periods between the second period T2 and the first period T1, where x ranges from 1 to 2m.

An operating principle of a single pixel circuit 3 will be described in the following.

In the first period T1, the first scan signal line Scan1 provides a low level, the first transistor T1 is turned on under an action of the low level provided by the first scan signal line Scan1, and the first reset signal provided by the first reset signal line Vref1 is transmitted to the gate electrode of the driving transistor T0 through the turned-on first transistor T1. During the second sub-period t2 of the first period T1, the gate electrode of the driving transistor T0 is reset by using the low level of the first reset signal. It should be noted that since the last sub-period of the first period T1 is the second sub-period t2, after the first period T1 ends, the gate electrode of the driving transistor T0 is maintained at the low-level potential of the first reset signal.

In the second period T2, the second scan signal line Scan2 provides a low level, the second transistor T2 is turned on under an action of the low level provided by the second scan signal line Scan2, and the second reset signal provided by the second reset signal line Vref2 is transmitted to the anode of the organic light-emitting element D through the turned-on second transistor T2. The anode of the organic light-emitting element D is reset by using the second reset signal. Meanwhile, the third transistor T3 and the fourth transistor T4 are turned on under an action of a low level provided by the second scan signal Line Scan2. A data signal provided by the data line Data is transmitted to the first electrode of the driving transistor T0 through the turned-on third transistor T3, and the data signal is transmitted to the gate electrode of the driving transistor T0 through the turned-on driving transistor T0 and the fourth transistor T4. In this way, the potential of the gate electrode of the driving transistor T0 is gradually increased from the low-level potential of the first reset signal. When the potential $V_{N1}$ of the gate electrode of the driving transistor T0 is increased to $V_{Data}$−|Vth|, the driving transistor T0 is turned off, and the data line Data is disconnected from the gate electrode of the driving transistor T0. As a result, the potential $V_{N1}$ of the electrode of the driving transistor T0 is maintained at $V_{Data}$−|Vth|, thereby capturing the threshold voltage of the driving transistor T0, i.e., achieving the threshold compensation.

In the third period T3, the light-emitting control signal line Emit provides a low level, and the fifth transistor T5 and the sixth transistor T6 are turned on under an action of a low level provided by the light-emitting control signal line Emit. The driving current signal converted from the data signal and the power signal is transmitted to the anode of the organic light-emitting element D through the turned-on sixth transistor T6, so as to drive the organic light-emitting element D to emit light. The driving current flowing to the organic light-emitting element D is $$I = \frac{1}{2}\mu_n C_{ox} \frac{W}{L}(PVDD - V_{N1} - |V_{th}|)^2,$$

where $\mu_n$ represents a migration rate of electrons, $C_{ox}$ represents a gate oxide capacitance per unit area, $$\frac{W}{L}$$

represents a channel width-to-length ratio of the driving transistor T0, and $V_{th}$ represents a threshold voltage of the driving transistor T0. $V_{N1}=V_{Data}$−|Vth| is substituted into the formula to obtain $$I = \frac{1}{2}\mu_n C_{ox} \frac{W}{L}(PVDD - V_{data})^2.$$

The threshold voltage of the driving transistor T0 is cancelled out, so that the driving current flowing into the organic light-emitting element D is not affected by the threshold voltage. In this way, an accuracy of the light-emitting brightness of the organic light-emitting element D can be improved.

Figure 12:
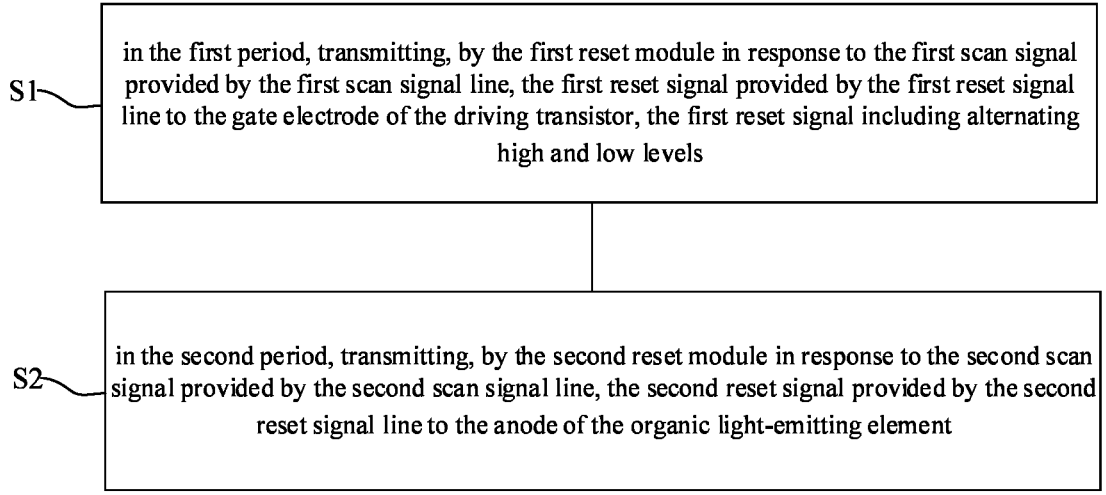
FIG. 12 is a flowchart of a driving method according to an embodiment of the present disclosure.

An embodiment of the present disclosure further provides a driving method for a display panel. The driving method is applied to the display panel described above. FIG. 12 is a flowchart of a driving method according to an embodiment of the present disclosure. With reference to FIG. 1, FIG. 2, FIG. 10, FIG. 11 and FIG. 12, the one-frame driving period of the pixel circuit 3 includes a first period T1 and a second period T2, and the driving method provided by this embodiment of the present disclosure includes following steps.

At step S1, in the first period T1, the first reset module 4 transmits, in response to the first scan signal provided by the first scan signal line Scan1, the first reset signal provided by the first reset signal line Vref1 to the gate electrode of the driving transistor T0. The first reset signal includes alternating high and low levels, and the gate electrode of the driving transistor T0 is reset by using the low level of the first reset signal.

At step S2, in the second time period T2, the second reset module 5 transmits, in response to the second scan signal provided by the second scan signal line Scan2, the second reset signal provided by the second reset signal line Vref2 to the anode of the organic light-emitting element D, and the anode of the organic light-emitting element D is reset by using the second reset signal.

With reference to the description of the above-mentioned embodiments, with the driving method provided by this embodiment of the present disclosure, the gate electrode of the driving transistor T0 and the anode of the organic light-emitting element D are reset by using different reset signals of the first reset module 4 and the second reset module 5. In this way, when it is needed to pull down the second reset signal to alleviate the sub-pixel light stealing phenomenon, the low-level potential of the first reset signal does not need to be pulled down as the second reset signal is pulled down, so that the low-level potential of the first reset signal can be higher than the potential of the pulled-down second reset signal. In this way, after the gate electrode of the driving transistor T0 is reset, a data signal can be written to the gate electrode of the driving transistor T0 on basis of a lightly higher low-level potential. Therefore, a voltage difference between an initial potential of the gate electrode of the driving transistor T0 and the data signal to be written is reduced, so that the data signal can be more sufficiently written during a charging period.

In addition, with the technical solution provided by this embodiment of the present disclosure, since the data signal is more sufficiently written during the charging period, the potential of the first node N1 after being charged can be higher. That is, the light-emitting brightness of the organic light-emitting element D is smaller, thereby reducing a difference between the brightness of refresh in the first frame and the brightness of refresh in other frames.

In addition, compared to a case in which the first reset signal is directly set to a DC signal having a constant voltage, in this embodiment of the present disclosure, the first reset signal is set to an AC signal having alternating high and low levels. In this case, when resetting the gate electrode of the driving transistor T0, the driving transistor T0 is first turned off under an action of a high level, and then turned on under an action of a low level. This can avoid the threshold voltage deviation due to a long-term bias of the driving transistor T0, thereby effectively alleviating the residual shadow phenomenon.

In an example, the second reset signal is a DC signal, and the voltage of the second reset signal is $V_2$, where $-5V \leq V_2 \leq -3V$. The second reset signal is set to a DC signal, so that the second reset signal has a stable low potential, thereby increasing reliability of reset of the anode of the organic light-emitting element D. Moreover, setting $V_2$ to be within a range from −5V to −3V can provide a lower reset potential to the anode of the organic light-emitting element D, thereby avoiding a potential difference between the anode and cathode of the organic light-emitting element D during a non-light-emission period, which would otherwise drive the organic light-emitting element D to emit light. In this way, the organic light-emitting element D will not emit light during the non-light-emission period, thereby effectively alleviating a sub-pixel light stealing phenomenon.

In an example, the low-level voltage $V_{1L}$ of the first reset signal is higher than the voltage $V_2$ of the second reset signal. In this way, when the anode of the organic light-emitting element D is reset by using the lower $V_2$ to alleviate the sub-pixel light stealing phenomenon, the display performance of the display panel can also be optimized by using the higher $V_{1L}$, such as making the charging more sufficient and reducing the difference between the brightness in the first frame and the brightness in other frames.

In an example, with reference to FIG. 11, the one-frame driving period of the pixel circuit 3 includes multiple sub-periods, and the multiple sub-periods include first sub-periods t1 and second sub-periods t2 that occur alternately. The first reset signal is at a high level in the first sub-period t1 and at a low level in the second sub-period t2. The first period T1 includes m first sub-period t1 and m second sub-period t2, and a first sub-period of the first period T1 is the first sub-period t1.

In view of this, in the first period T1, the first reset module 4 transmits, in response to the first scan signal provided by the first scan signal line Scan1, the first reset signal provided by the first reset signal line Vref1 to the gate electrode of the driving transistor T0 by following steps. In the period T1, the first reset module 4 transmits the first reset signal to the gate electrode of the driving transistor T0 in response to the first scan signal, and in the second sub-period t2 of the first period T1, the gate electrode of driving transistor T0 is reset by using the low level of the first reset signal. Since the first sub-period of the first period T1 is the first sub-period t1 and the last sub-period of the first period T1 is the second sub-period t2, after the first period T1 ends, the gate electrode of the driving transistor T0 can be remained at a stable low-level potential.

The second period T2 includes one first sub-period t1 or one second sub-period t2. When the pixel circuit 3 belongs to an $x^{th}$ pixel row 2 in the pixel set 1, there are (x−1) sub-periods between the second period T2 and the first period T1, where x is within a range from 1 to 2m. For example, when the pixel circuit 3 is included in a second pixel row 2 in the pixel set 1, there is one sub-period between the second period T2 and the first period T1; and when the pixel circuit 3 is included in a third pixel row 2 in the pixel set 1, there are two sub-periods between the second period T2 and the first period T1.

It should be noted that for the $2^{nd}$ to $2m^{th}$ pixel rows 2 in the pixel set 1, although there is at least one sub-period between the second period T2 and the first period T1 corresponding to these pixel rows 2, since the first scan signal corresponding to each of these pixel rows 2 is at a high level in the at least one sub-period, the potential of the gate electrode of the driving transistor T0 will not be affected. When the second period T2 starts, the data signal can still be normally written.

In addition, it should be noted that, with the driving method described above, with reference to FIG. 7 and FIG. 8, for the second shift register unit 9 that provides a signal to the second scan signal line Scan 2, each second shift register unit 9 only needs to drive one pixel row 2. Therefore, a delay of the second scan signal in a transmission process can be reduced, and each pixel row 2 can be more accurately driven by using the second scan signal.

In an example, with further reference to FIG. 11, a duration of the second sub-period t2 is equal to a duration of the first sub-period t1. The second period T2 of the pixel circuit 3 in some pixel rows 2 corresponds to the first sub-period t1, and the second period T2 of the pixel circuit 3 in some other pixel rows 2 corresponds to the second sub-period t2. Therefore, the duration of the first sub-period t1 being equal to the duration of the second sub-period t2 can allow that the reset time and the data writing time for the anode of the organic light-emitting element D corresponding to the pixel circuits 3 of different pixel rows 2 are identical, thereby increasing display uniformity.

In an example, with reference to FIG. 2, FIG. 10, and FIG. 11, the pixel circuit 3 further includes: a data signal writing module 10 that is electrically connected to the second scan signal line Scan2, the data line Data, and the first electrode of the driving transistor T0; a compensation control module 13 that is electrically connected to second scan signal line Scan2, the gate electrode of driving transistor T0 and the second electrode of the driving transistor T0; and a light-emitting control module 14 that is electrically connected to the light-emitting control signal line Emit, the power signal line PVDD, the first electrode of the driving transistor T0, the second electrode of the driving transistor T0, and the anode of the organic light-emitting element D.

Figure 13:
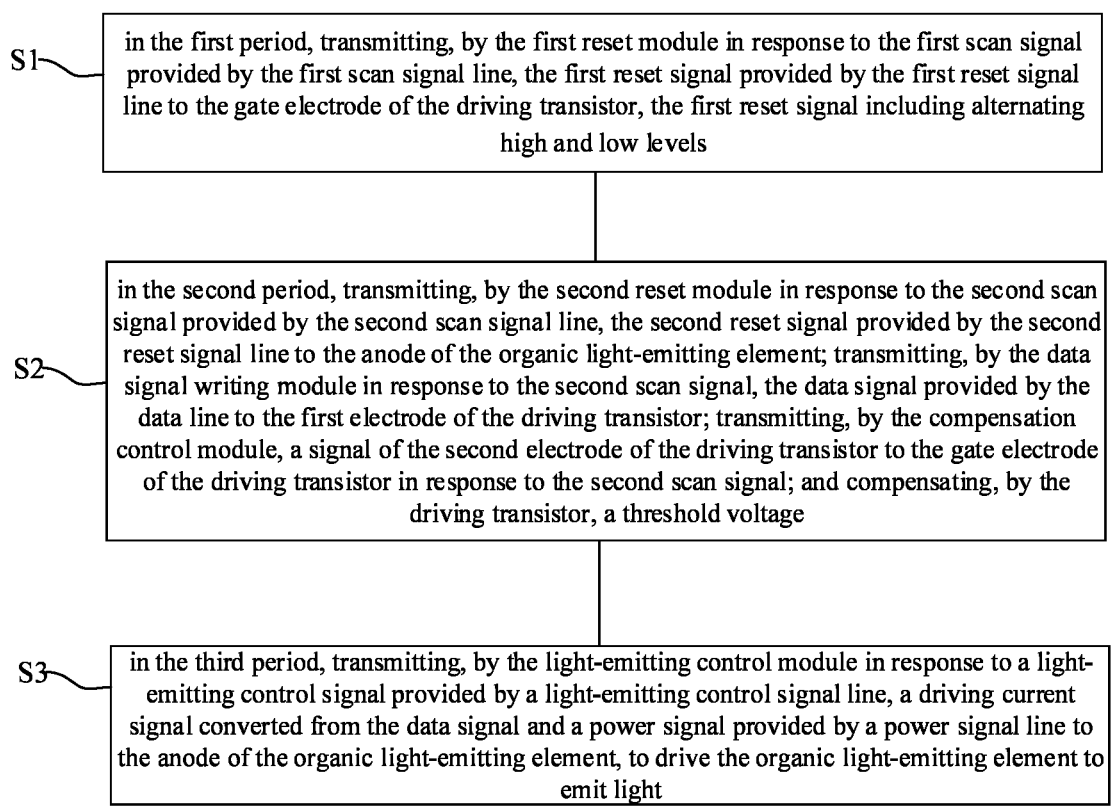
FIG. 13 is a flowchart of another driving method according to an embodiment of the present disclosure.

Based on the structure described above, the one-frame driving period of the pixel circuit 3 further includes a third period T3. FIG. 13 is a flowchart of another driving method according to an embodiment of the present disclosure. As shown in FIG. 13, the step S2 further includes following steps. In the second period T2, the data signal writing module 10 transmits, in response to the second scan signal, the data signal provided by the data line Data to the first electrode of driving transistor T0; the compensation control module 13, in response to the second scan signal, transmits the signal of the second electrode of driving transistor T0 to the gate electrode of the driving transistor T0; and the transistor T0 compensates the threshold voltage.

In addition, the driving method further includes step S3. At step S3, in the third period T3, the light-emitting control module 14 transmits, in response to the light-emitting control signal provided by the light-emitting control signal line Emit, the driving current signal converted from the data signal and the power signal provided by the power signal line PVDD to the anode of the organic light-emitting element D, so as to drive the organic light-emitting element D to emit light.

An operating principle thereof has been described in details in the embodiments described above, and will not be repeated herein.

Figure 14:
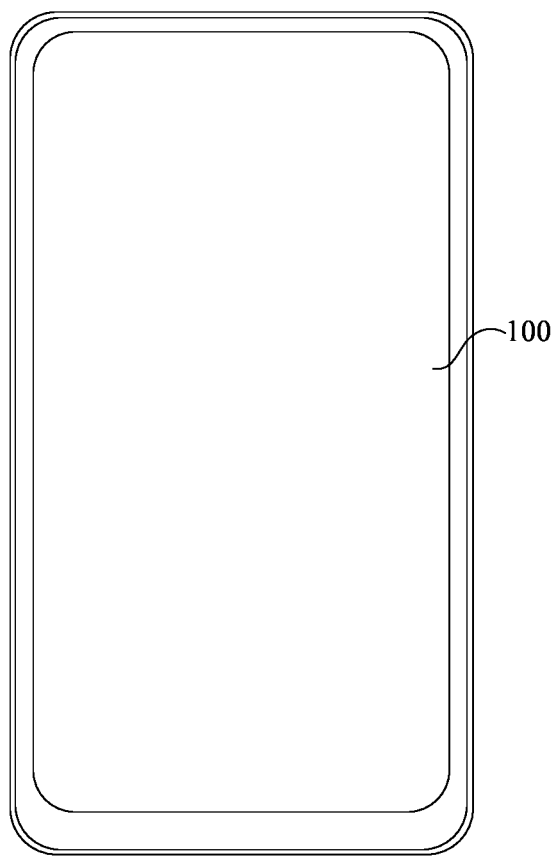
FIG. 14 is a schematic diagram of a structure of a display device according to an embodiment of the present disclosure.

An embodiment of the present disclosure further provides a display device. As shown in FIG. 14, which is a schematic diagram of a structure of display device provided by an embodiment of the present disclosure, the display device includes the display panel 100 described above. A structure of the display panel 100 has been described in details in the embodiments described above, and will not be repeated herein. It should be noted that the display device shown in FIG. 14 is merely for schematic illustration. The display device may be any electronic device with a display function, such as a cellphone, a tablet computer, a notebook computer, an electronic paper book, or a television.

The display device provided by this embodiment of the present disclosure includes the display panel 100 described above. Therefore, with the display device, a sub-pixel light stealing phenomenon can be alleviated, and meanwhile, the data signal can be more sufficiently written during the charging period, the difference between the brightness in the first frame and the brightness in other frames can be reduced, and the residual shadow phenomenon can be effectively alleviated. Thus, the display performance of the display device can be optimized.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising n pixel sets, wherein each of the n pixel sets comprises 2m pixel rows arranged along a first direction, where n and m are positive integers, wherein each of the 2m pixel rows comprises a plurality of pixel circuits arranged along a second direction, and the second direction intersects with the first direction,
wherein each of the plurality of pixel circuits comprises:
a driving transistor;
a first reset module configured to transmit, in response to a first scan signal provided by a first scan signal line, a first reset signal provided by a first reset signal line to a gate electrode of the driving transistor, and the gate electrode of the driving transistor is configured to receive a high level and a low level that are configured to reset the gate electrode of the driving transistor; and
a second reset module configured to transmit, in response to a second scan signal provided by a second scan signal line, a second reset signal provided by a second reset signal line to an anode of an organic light-emitting element.

2. The display panel according to claim 1, wherein the high level received by the gate electrode of the driving transistor has a voltage $V_{1H}$, where $V_{1H} \leq 5V$.

3. The display panel according to claim 1, wherein a voltage of the second reset signal is $V_2$, where $-5V \leq V_2 \leq -3V$.

4. The display panel according to claim 1, wherein the gate electrode of the driving transistor is reset by the high level and then is reset by the low level.

5. The display panel according to claim 1, further comprising:
a first shift register comprising n first shift register units that are cascaded, wherein the n first shift register units one-to-one correspond to the n pixel sets, and each of the n first shift register units is electrically connected to 2m first scan signal lines of the 2m pixel rows corresponding to the first shift register unit.

6. The display panel according to claim 1, wherein m=1.

7. The display panel according to claim 1,
wherein the first reset module comprises a first transistor, and the first transistor comprises a gate electrode electrically connected to the first scan signal line, a first electrode electrically connected to the first reset signal line, and a second electrode electrically connected to the gate electrode of the driving transistor, and
wherein the second reset module comprises a second transistor, and the second transistor comprises a gate electrode electrically connected to the second scan signal line, a first electrode electrically connected to the second reset signal line, and a second electrode electrically connected to the anode of the organic light-emitting element.

8. The display panel according to claim 1, wherein each of the plurality of pixel circuits further comprises:
a data signal writing module electrically connected between a data signal and a first electrode of the driving transistor and configured to transmit the data signal provided by a data line to the first electrode of the driving transistor;
a compensation control module electrically connected between the gate electrode of the driving transistor and a second electrode of the driving transistor and configured to detect and compensate an offset of a threshold voltage of the driving transistor;
a light-emitting control module configured to transmit, in response to a light-emitting control signal provided by a light-emitting control signal line, a driving current signal converted from the data signal and a power signal provided by a power signal line to the anode of the organic light-emitting element; and
a storage capacitor comprising a first electrode plate electrically connected to the power signal line, and a second electrode plate electrically connected to the gate electrode of the driving transistor.

9. The display panel according to claim 8, wherein
the data signal writing module comprises a third transistor, and the third transistor comprises a first electrode electrically connected to the data line, and a second electrode electrically connected to the first electrode of the driving transistor;
wherein the compensation control module comprises a fourth transistor, and the fourth transistor comprises a first electrode electrically connected to the second electrode of the driving transistor, and a first electrode electrically connected to the gate electrode of the driving transistor; and
wherein the light-emitting control module comprises a fifth transistor and a sixth transistor, the fifth transistor comprises a gate electrode electrically connected to the light-emitting control signal line, a first electrode electrically connected to the power signal line, and a second electrode electrically connected to the first electrode of the driving transistor, and the sixth transistor comprises a gate electrode electrically connected to the light-emitting control signal line, a first electrode electrically connected to the second electrode of the driving transistor, and a second electrode electrically connected to the anode of the organic light-emitting element.

10. A pixel circuit, comprising:
a driving transistor electrically connected between a power signal line and an organic light-emitting element;
a first reset module configured to reset a gate electrode of the driving transistor with a high level and a low level; and
a second reset module configured to reset an anode of the organic light-emitting element,
wherein a driving period of the pixel circuit comprises a plurality of sub-periods,
wherein, in a first sub-period of the plurality of sub-periods, the first reset module is configured to reset the gate electrode of the driving transistor by the high level; and
wherein, in a second sub-period of the plurality of sub-periods, the first reset module is configured to reset the gate electrode of the driving transistor by the low level, wherein the plurality of sub-periods is arranged sequentially in a timing sequence, the first sub-period is a first one of the plurality of sub-periods in the timing sequence, and the second sub-period is a second one of the plurality of sub-periods in the timing sequence.

11. The pixel circuit according to claim 10, wherein a high level of a first reset signal of the first reset module has a voltage $V_{1H}$, where $V_{1H} \leq 5V$.

12. A display panel, comprising a pixel circuit,
wherein the pixel circuit comprises:
a driving transistor electrically connected between a power signal line and an organic light-emitting element,
a first reset module configured to reset a gate electrode of the driving transistor with a high level and a low level, and
a second reset module configured to reset an anode of the organic light-emitting element;
wherein a driving period of the pixel circuit comprises a plurality of sub-periods,
wherein, in a first sub-period of the plurality of sub-periods, the first reset module is configured to reset the gate electrode of the driving transistor by the high level; and
wherein, in a second sub-period of the plurality of sub-periods, the first reset module is configured to reset the gate electrode of the driving transistor by the low level, wherein the plurality of sub-periods is arranged sequentially in a timing sequence, the first sub-period is a first one of the plurality of sub-periods in the timing sequence, and the second sub-period is a second one of the plurality of sub-periods in the timing sequence.

13. The display panel according to claim 12, wherein a high level of a first reset signal of the first reset module has a voltage $V_{1H}$, where $V_{1H} \leq 5V$.

* * * * *